United States Patent [19]

Yamazaki

[11] Patent Number: 4,999,517

[45] Date of Patent: Mar. 12, 1991

[54] INVERTER CIRCUIT

[75] Inventor: Toru Yamazaki, Tokyo, Japan

[73] Assignee: NEC Corporation, Tokyo, Japan

[21] Appl. No.: 433,472

[22] Filed: Nov. 8, 1989

[30] Foreign Application Priority Data

Nov. 8, 1988 [JP] Japan .................. 63-282711

[51] Int. Cl.$^5$ .......................... H03K 17/04
[52] U.S. Cl. ................... 307/446; 307/445; 307/520; 307/270
[58] Field of Search ............... 307/446, 445, 570, 270

[56] References Cited

U.S. PATENT DOCUMENTS

| 4,719,370 | 1/1988 | Sugimoto | 307/570 |
| 4,804,869 | 2/1989 | Masuda et al. | 307/446 |
| 4,808,850 | 2/1989 | Masuda et al. | 307/570 |
| 4,880,998 | 11/1989 | Ueda | 307/446 |
| 4,906,868 | 3/1990 | Maki et al. | 307/570 |
| 4,926,069 | 5/1990 | Yamazaki | 307/446 |

FOREIGN PATENT DOCUMENTS

| 0025423 | 2/1984 | Japan | 307/446 |
| 0079641 | 5/1984 | Japan | 307/446 |

Primary Examiner—Stanley D. Miller
Assistant Examiner—Scott A. Ouellette
Attorney, Agent, or Firm—Helfgott & Karas

[57] ABSTRACT

An inverter circuit comprises a bipolar transistor having a collector and an emitter of a first conductivity type, and at least three field effect transistors of which the first one includes a channel of a second conductivity type, the second one includes a channel of the first conductivity type, and the third one includes a channel of the first conductivity type. The first field effect transistor with the channel of the second conductivity type is connected at the gate thereof to ground to be permanently turned on. As a result, the first field effect transistor is used as a load. The inverter circuit provides the reduction in the number of transistors typically used therein and decrease in an input capacitance, even if a multi-gate input structure is adopted.

3 Claims, 6 Drawing Sheets

INVERTER CIRCUIT

FIELD OF THE INVENTION

This invention relates to an inverter circuit and more particularly, to an inverter circuit composed of field effect transistors and a bipolar transistor to provide a high speed and a low power dissipation.

BACKGROUND OF THE INVENTION

A conventional inverter circuit comprises a PMOS, first to third NMOSs, and first and second NPN transistors. In the inverter circuit, a drain, a source, and a gate of the PMOS are connected to a drain of the first NMOS, a power supply terminal, and an input terminal, respectively, and a drain, a source, and a gate of the second NMOS are connected to an output terminal, a drain of the third NMOS, and the input terminal, respectively. A base, a collector, and an emitter of the first NPN transistor are connected to a connecting point between the drains of the PMOS and the first NMOS, the power supply terminal, the output terminal, respectively, and a base, a collector, an emitter of the second NPN transistor are connected to a connecting point between the source of the second NMOS and the drain of the third MNOS, the output terminal, and ground, respectively. Further, a gate and a source of the first NMOS are connected to the input terminal and ground, respectively, and a gate and a source of the third NMOS are connected to the output terminal and ground, respectively. Thus, a CMOS inverter is structured, wherein charges which are accumulated at the base of the first NPN transistor are drawn therefrom to ground by the first NMOS, so that the first NPN transistor is turned off, when the PMOS is turned off and the second NMOS is turned on, while charges which are accumulated at the base of the second NPN transistor are drawn therefrom to ground by the third NMOS, so that the second NPN transistor is turned off, when the PMOS is turned on and the second NMOS is turned off.

However, the conventional inverter circuit has a disadvantage in that it does not operate with a high speed, because an input capacitance is large due to a multi-gate input structure, and plural transistors are vertically arranged. Further, the conventional inverter circuit has other disadvantages in that an occupied area is large, and a power dissipation is large, because the number of circuitry elements is increased. The same disadvantage occurs in three input NAND and NOR circuits which are expanded from the inverter circuit described above.

SUMMARY OF THE INVENTION

Accordingly, it is an object of the invention to provide an inverter circuit which operates with a high speed.

It is a further object of the invention to provide an inverter circuit in which an occupied area as a decoder, to which three-input NAND and NOR circuits are applied, is small, and a power dissipation is decreased.

According to the invention, an inverter circuit, comprises:

a bipolar transistor having a collector and an emitter of a first conductivity type said collector of the bipolar transistor being connected to said output terminal, and an emitter of the bipolar transistor being connected to ground;

a first field effect transistor including a channel of a second conductivity type, an electrode selected from a source and a drain of the first field effect transistor being connected to the output terminal, a remaining electrode selected from the source and the drain of the first field effect transistor being connected to a power supply terminal, and a gate of the first electric field effect transistor being connected to ground;

a second field effect transistor including a channel of a first conductivity type, a gate of the second field effect transistor being connected to an input terminal, an electrode selected from a source and a drain of the second field effect transistor being connected to a base of the bipolar transistor, and a remaining electrode selected from the source and the drain of the second field transistor being connected to the output terminal; and a third field effect transistor including a channel of a first conductivity type, an electrode selected from a source and a drain of the third field effect transistor being connected to ground, a remaining electrode selected from the source and the drain of the third field effect transistor being connected to the base of the bipolar transistor and to an electrode selected from the source and the drain of the second field effect transistor, and a gate of the third electric field effect transistor being connected to the power supply terminal.

BRIEF DESCRIPTION OF THE DRAWINGS

The invention will be explained in more detail in conjunction with appended drawings, wherein.

DESCRIPTION OF THE PREFERRED EMBODIMENTS

Before explaining an inverter circuit in the preferred embodiment according to the invention, the aforementioned conventional inverter circuit will be explained in FIG. 1.

In the conventional inverter circuit, reference numeral 3 indicates a PMOS, and 5 a NMOS which provide a CMOS inverter. The reference numerals 7 and 8 indicate NPN transistors, respectively, wherein a collector C of the NPN transistor 7 is connected to a power supply terminal 9, an emitter E thereof is connected to an output terminal 2, and a base B thereof is connected to a drain D of the PMOS 3. A collector C of the NPN transistor 8 is connected to the output terminal 2 and a drain D of the NMOS 5, a base B thereof is connected to a source S of the NMOS 5, and an emitter E thereof is connected to ground. A drain D of a NMOS 4 is connected to the drain D of the PMOS 3 and the base B of the NPN transistor 7, and a source S thereof is connected to ground. A drain D of a NMOS 6 is connected to the source S of the NMOS 5 and the base B of the NPN transistor 8, and a source thereof is connected to ground. An input terminal 1 of the inverter circuit is connected to gates of the PMOS 3, and the NMOSs 4 and 5.

Figures 1, 2:
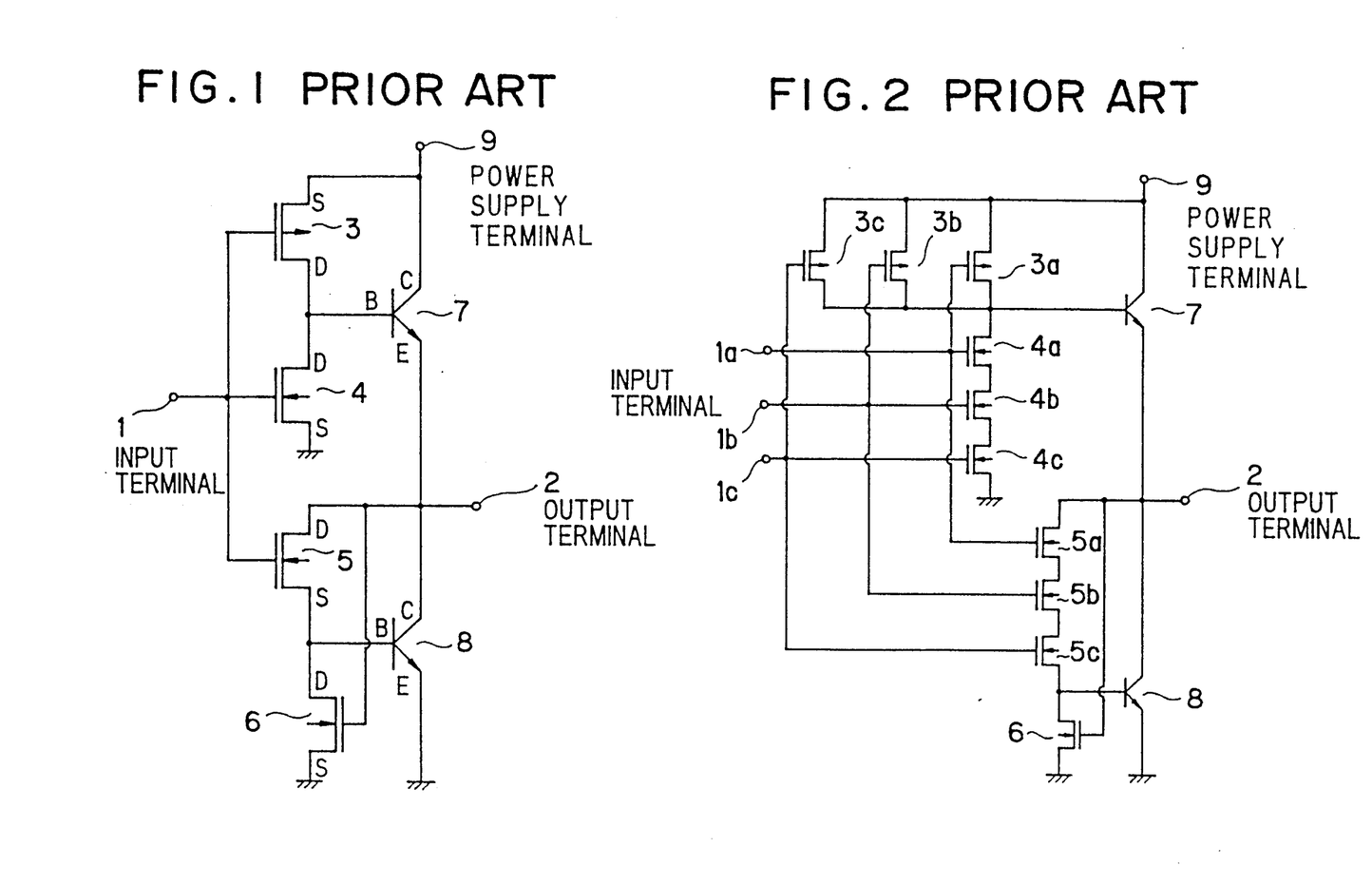
FIG. 1 is a circuitry diagram showing a conventional inverter circuit.
FIGS. 2 and 3 are circuitry diagrams showing conventional inverter circuits in the form of three-input NAND and NOR circuits.

FIG. 2 shows a conventional three-input NAND circuit which is expanded from the inverter circuit as shown in FIG. 1, wherein like parts are indicated by like reference numerals, except that the NAND circuit includes three PMOSs 3a, 3b and 3c (in parallel) in place of the PMOS 3 in FIG. 1, and three NMOSs 4a, 4b and 4c (in serial) and three NMOSs 5a, 5b and 5c (in serial) in place of the NMOSs 4 and 5 in FIG. 1, and that an input terminal 1a is connected to gates of the PMOS 3a and the NMOSs 4a and 5a, and input terminals 1b and 1c are connected to gates of the PMOS 3b and the NMOSs 4b and 5b, and to gates of the PMOS 3c and the NMOSs 4c and 5c, respectively.

Figure 3:
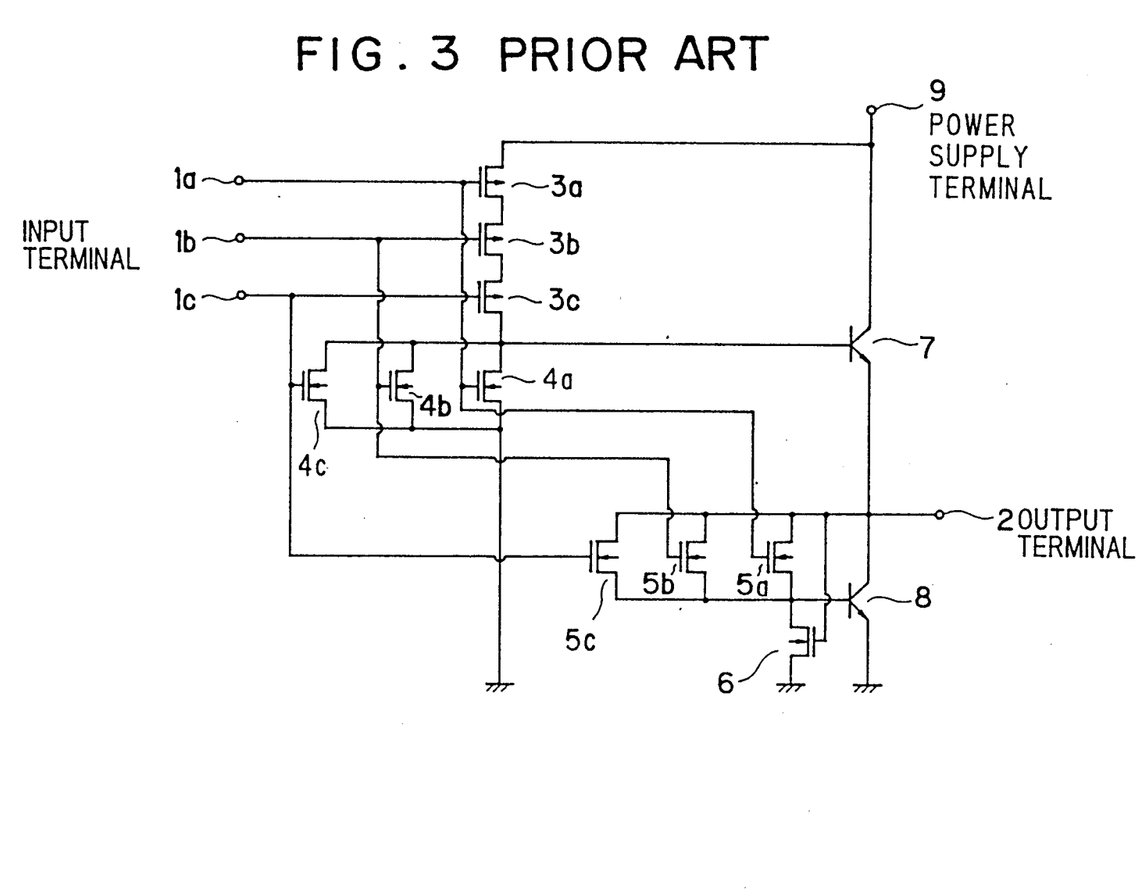

FIG. 3 shows a conventional three-input NOR circuit which is expanded from the inverter circuit as shown in FIG. 1, wherein like parts are indicated by like reference numerals, except that the NOR circuit includes three PMOSs 3a, 3b and 3c (in serial) in place of the PMOS 3 in FIG. 1, and three NMOSs 4a, 4b and 4c (in parallel) and three NMOSs 5a, 5b and 5c (in parallel) in place of the NMOSs 4 and 5 in FIG. 1, and that an input terminal 1a is connected to gates of the PMOS 3a and the NMOSs 4a and 4b, and input terminals 1b and 1c are connected to gates of the PMOS 3b and the NMOSs 4b and 5b, and to gates of the PMOS 3c and the NMOSs 4c and 5c, respectively.

Such a multi-gate input structure as the three-input NAND and NOR circuits is applied to a decoder circuit, etc. in a SRAM gate array, etc.

Figure 4:
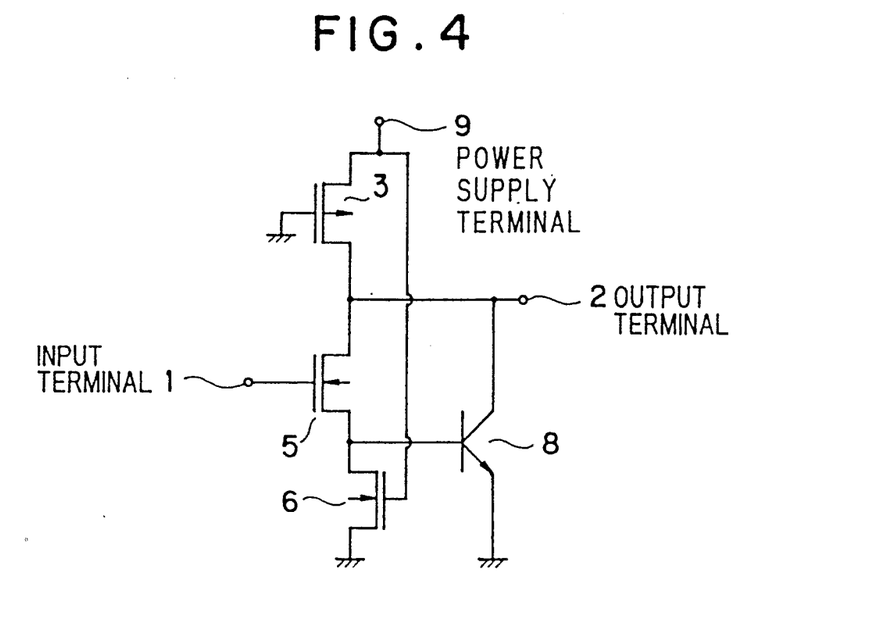
FIG. 4 is a circuitry diagram showing an inverter circuit of the first embodiment according to the invention.

Next, an inverter circuit in the preferred embodiment according to the invention will be explained in FIG. 4. The inverter circuit comprises a PMOS 3 which is a field effect transistor of one conductivity type, NMOSs 5 and 6 which are field effect transistors of another conductivity type, and a NPN bipolar transistor 8. A gate of the PMOS 3 is connected to ground, and a source thereof is connected to a power supply terminal 9. An input terminal 1 is connected to a gate of the NMOS 5. A drain of the NMOS 6 is connected to a base of the NPN transistor 8 and a source of the NMOS 5, a gate thereof is connected to the power supply terminal 9, and a source thereof is connected to ground. A collector of the NPN transistor 8, a drain of the PMOS 3, and a drain of the NMOS 5 are commonly connected to an output terminal 2. An emitter of the NPN transistor 8 is connected to ground.

In operation, when an input signal applied to the input terminal 1 changes from "high" to "low", the NMOS 5 is turned off. Charges which are accumulated at the base of the NPN transistor 8 are drawn therefrom through the NMOS 6 to the ground, so that the NPN transistor is turned off. On the other hand, the PMOS 3 is permanently turned on for grounding of the gate thereof, so that an output signal supplied from the output terminal 2 which is connected to the drain of the PMOS 3 changes from "low" to "high".

Next, when the input signal changes from "low" to "high", the NMOS 5 is turned on. Then, current flows from the power supply terminal 9 through the NMOS 6 and the NMOS 5 to the base of the NPN transistor 8, so that the NPN transistor 8 is turned on. Thus, the output signal changes from "high" to "low" at the output terminal 2.

In the inverter circuit, the gate of the NMOS 6 is connected to the power supply terminal 9 to be permanently turned on, so that through-current flows from the power supply terminal 9 to ground. In this case, where a frequency of the input signal is high, for instance, more than 10 MHz, the increase in power dissipation which is resulted from the through-current is negligible. In more detail, a relation of a power dissipation P, a power supply voltage V, an input capacitance C, and an operation frequency f is generally defined by an equation (1), $$P \propto f \cdot C \cdot V^2 \tag{1}$$

In the invention, where the input signal is "high", the through-current flows from the power supply terminal 9 to the ground. Therefore, an equation (2) is obtained based on the equation (1).

$$P \propto f \cdot C \cdot V^2 + P_{dc} \tag{2}$$

where $P_{dc}$ is a power dissipation caused by the through-current.

Figure 5:
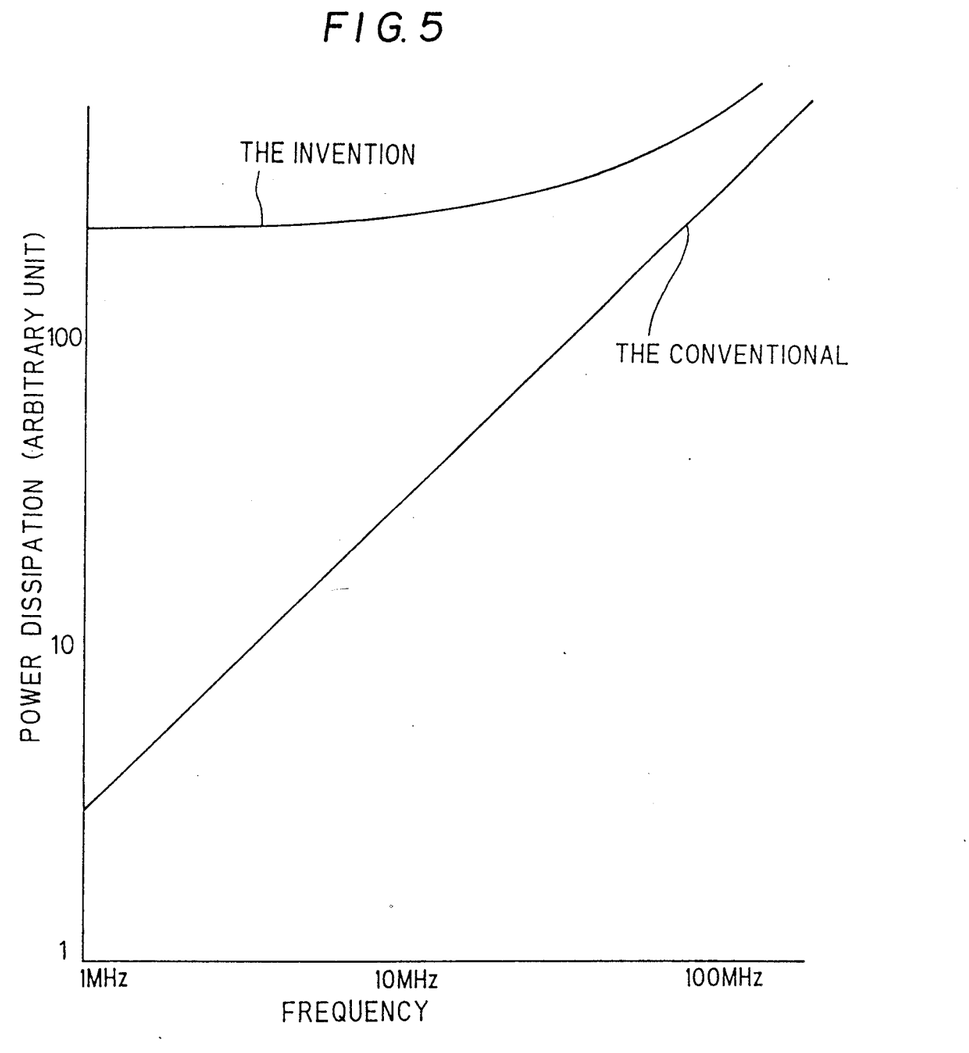
FIG. 5 is an explanatory graph showing a power dissipation dependent on a frequency in the inverter circuit of the first embodiment and the conventional inverter circuit.

FIG. 5 shows the power dissipation P dependent on the operation frequency f based on the equation (2). As understood therefrom, as the operation frequency f is increased, a proportion of the term $P_{dc}$ relative to the whole power dissipation P is decreased. Therefore, the power dissipation $P_{dc}$ (less than 2.5 μW) which is a stand-by power is negligible, where the operation frequency f is a predetermined high value. To be more concrete, where the operational frequency is approximately 100 MHz, the power dissipation is substantially equal to each other between the invention and the conventional one.

Further, an input capacitance is largely decreased as compared to the conventional inverter circuit, because the NMOS 5 is only connected to the input terminal 1. This effect becomes remarkable, as the number of multi-gates is increased. Therefore, the invention is very useful for a circuit having a multi-gate input structure to operate with a high speed.

In this embodiment, it is preferable that current flows into the base of the NPN transistor 8 effectively by decreasing current flowing through the NMOS 6, when the NMOS 5 is turned on, while charges accumulated at the base of the NPN transistor 8 are drawn therefrom to the ground, when the NMOS 5 is turned on. For this purpose, a channel width of the NMOS 6 is preferable to be selected in a range of 1/5 to 1/10 relative to that of the NMOS 5. The NMOS 6 may be replaced by a resistor.

Figure 6:
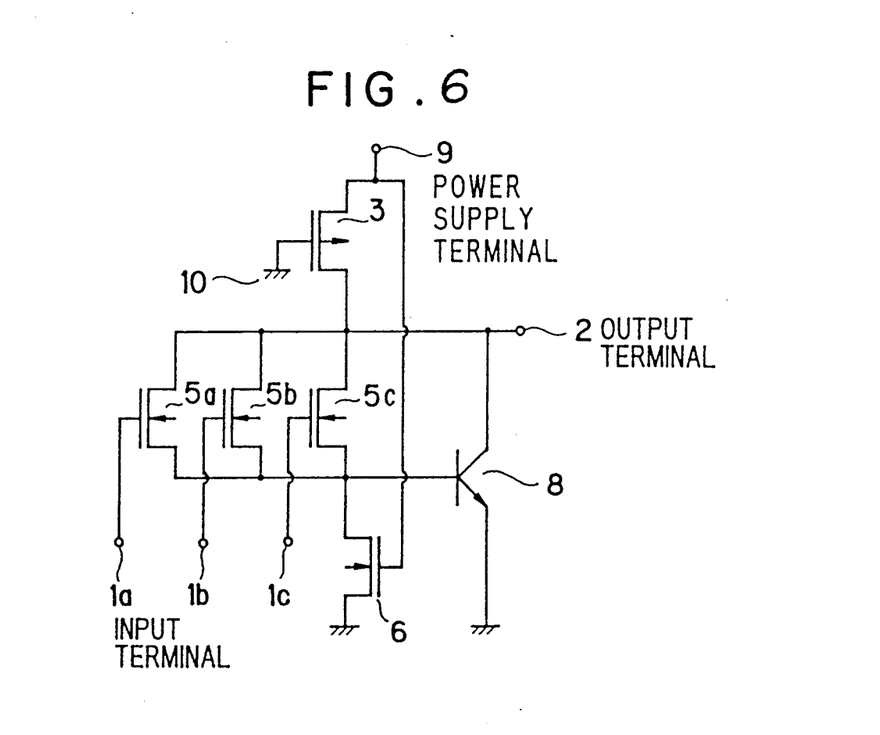
FIGS. 6 and 7 are circuitry diagrams showing inverter circuits in the form of three-input NAND and NOR circuit of the second and third embodiments according to the invention.

FIG. 6 shows an inverter circuit in the form of a three-input NOR circuit in the second embodiment of the invention. In the three-input NOR circuit, like parts are indicated by like reference numerals, except that the NMOS 5 is replaced by three NMOSs 5a, 5b and 5c (in parallel), the gates of which are connected to three inputs 1a, 1b and 1c, respectively. In this second embodiment, an input capacitance for the PMOS 3 is largely decreased as compared to the conventional one, because the gate of the PMOS 3 is connected to ground. Further, there are not provided PMOS gate transistors in parallel or serial to be connected to each other in the three-input NOR circuit. As a result, a high speed operation can be realized therein. As a matter of course, the number of transistors is decreased, so that an area occupied by the circuit is decreased.

Figure 7:
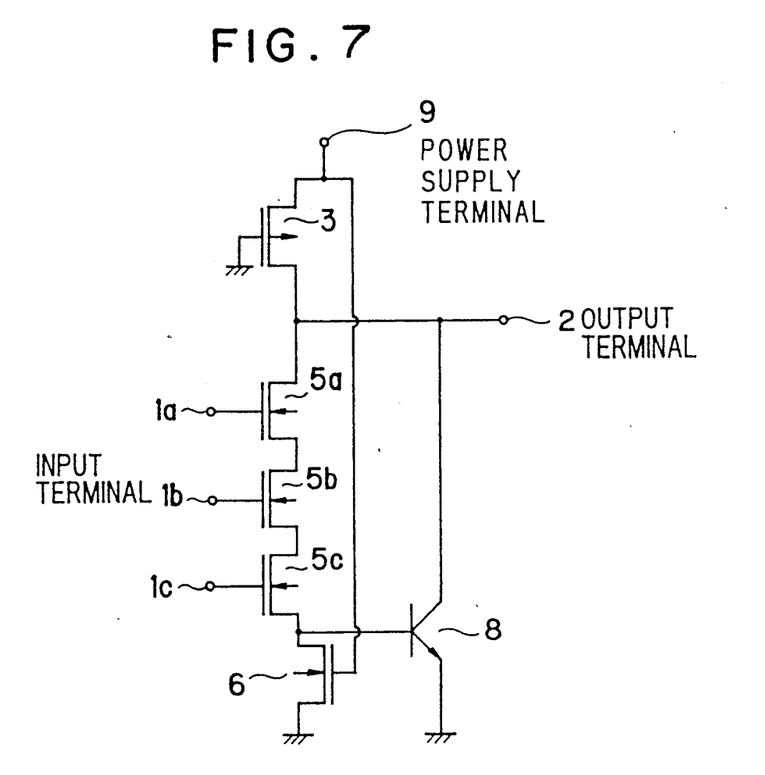

FIG. 7 shows an inverter circuit in the form of a three-input NAND circuit in the third embodiment according to the invention. In the three-input NAND circuit, like parts are indicated by like reference numerals as used in FIG. 6, except for the NMOSs 5a, 5b and 5c are arranged in serial.

Figure 8:
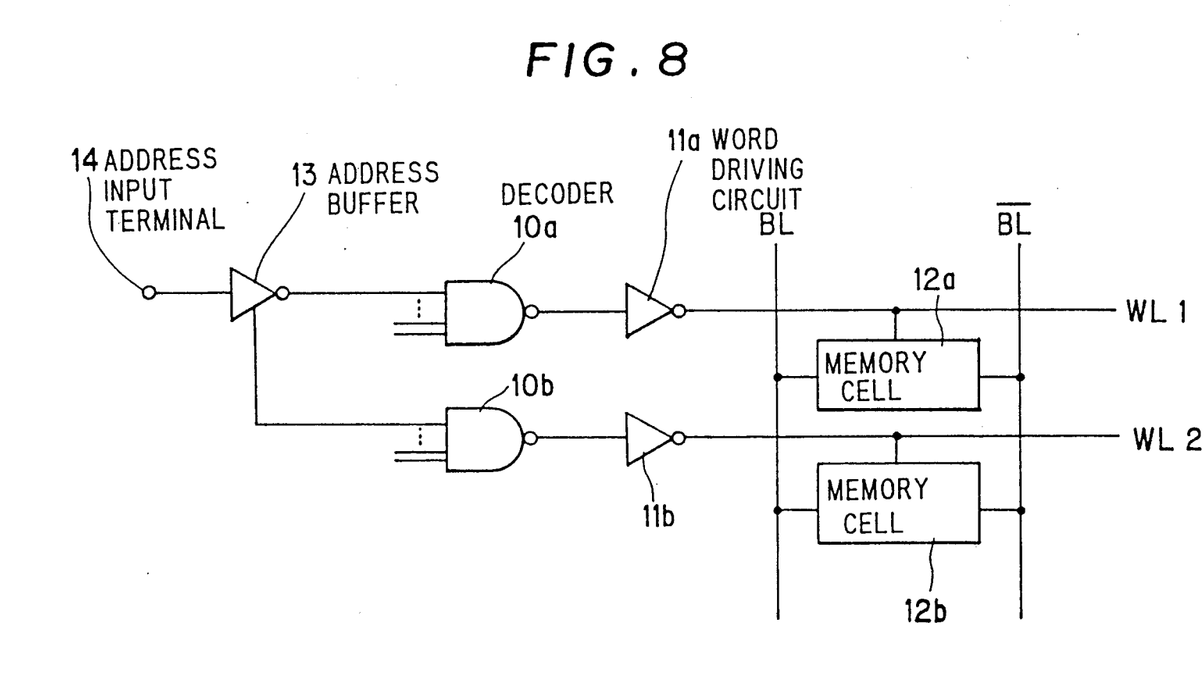
FIG. 8 is a circuitry diagram showing an address decoder to which the invention is applied.

FIG. 8 shows an address decoder in a large capacity of a SRAM including decoders 10a, 10b, ... prepared in the invention. The address decoder comprises an address input terminal 14, to which an address signal is supplied, an address buffer 13 through which the address signal is transmitted, the decoders 10a, 10b, ..., at one of which an output signal becomes "low" in accordance with the address signal, word driving circuits 11a, 11b, ..., one of which is enabled by the output signal of "low", and memory cells 12a, 12b, ... one of which is addressed by an enabling signal on one of word lines WL1, WL2, ... and a bit signal on bit lines BL, $\overline{BL}$, ....

In operation, one of the memory cells 12a, 12b ... is addressed in accordance with the decoding of the address signal in the decoders 10a, 10b, ... and the bit signal on the bit lines BL, $\overline{BL}$, .... According to the invention, because the decoders 10a, 10b, ... can be smaller as described before, the address decoder can be smaller as compared to a conventional address decoder.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. An inverter circuit, comprising:
    a bipolar transistor including a collector of a first conductivity type being connected to an output terminal, and an emitter of said first conductivity type being connected to ground;
    a first field effect transistor including a channel of a second conductivity type, an electrode selected from a source and a drain of said first field effect transistor being connected to said output terminal, a remaining electrode selected from said source and said drain of said first field effect transistor being connected to a power supply terminal, and a gate of said first field effect transistor being connected to ground;
    a second field effect transistor including a channel of said first conductivity type, a gate of said second field effect transistor being connected to an input terminal, an electrode selected from a source and a drain of said second field effect transistor being connected to a base of said bipolar transistor, and a remaining electrode selected from said source and said drain of said second field transistor being connected to said output terminal; and
    a third field effect transistor including a channel of said first conductivity type, an electrode selected from a source and a drain of said third field effect transistor being connected to ground, a remaining electrode selected from said source and said drain of said third field effect transistor being connected to said base of said bipolar transistor and to an electrode selected from said source and said drain of said second field effect transistor, and a gate of said third field effect transistor being connected to said power supply terminal.

2. An inverter circuit, comprising:
    a bipolar transistor including a collector of a first conductivity type being connected to an output terminal, and an emitter of said first conductivity type being connected to ground;
    a first field effect transistor including a channel of a second conductivity type, an electrode selected from a source and a drain of said first field effect transistor being connected to said output terminal, a remaining electrode selected from said source and said drain of said first field effect transistor being connected to a power supply terminal, and a gate of said first field effect transistor being connected to ground;
    a plurality of field effect transistors each including a channel of a first conductivity type, respective gates of said plurality of field effect transistors being connected to corresponding input terminals, an electrode selected from a source and a drain in each of said plurality of field effect transistors being connected to a base of said bipolar transistor, and a remaining electrode selected from said source and said drain in each of said plurality of field transistors being connected to said output terminal; and
    an additional field effect transistor including a channel of a first conductivity type, an electrode selected from a source and a drain of said additional field effect transistor being connected to ground, a remaining electrode selected from said source and said drain of said additional field effect transistor being connected to said base of an electrode selected from said source and said drain in each of said plurality of field effect transistors, and a gate of said additional field effect transistor being connected to said power supply terminal.

3. An inverter circuit, comprising:
    a bipolar transistor including a collector of a first conductivity type being connected to an output terminal, and an emitter of said first conductivity type being connected to ground;
    a first field effect transistor including a channel of a second conductivity type, an electrode selected from a source and a drain of said first field effect transistor being connected to said output terminal, a remaining electrode selected from said source and said drain of said first field effect transistor being connected to a power supply terminal, and a gate of said first field effect transistor being connected to ground;
    a plurality of field effect transistors connected serially with respect to said first field effect transistor and each including a channel of a first conductivity type, respective gates of said plurality of field effect transistors being connected to corresponding input terminals, an electrode selected from a source and a drain of one field effect transistor of said plurality which is positioned at the farthest from said first field effect transistor being connected to a base of said bipolar transistor, and a remaining electrode selected from a source and a drain of one field effect transistor of said plurality which is positioned at the nearest from said first field effect transistor being connected to said output terminal; and an additional field effect transistor including a channel of a first conductivity type, an electrode selected from a source and a drain of said additional field effect transistor being connected to ground, a remaining electrode selected from said source and said drain of said additional field effect transistor being connected to said base of said bipolar transistor and to an electrode selected from said source and said drain of said one field effect transistor of said plurality which is positioned at the farthest from said first field effect transistor, and a gate of said additional field effect transistor being connected to said power supply terminal.

* * * * *